(12) United States Patent
Kato

(10) Patent No.: US 9,373,773 B2
(45) Date of Patent: Jun. 21, 2016

(54) MULTI-LAYER PIEZOELECTRIC ELEMENT, AND PIEZOELECTRIC ACTUATOR, INJECTION DEVICE, AND FUEL INJECTION SYSTEM PROVIDED WITH THE MULTI-LAYER PIEZOELECTRIC ELEMENT

(71) Applicant: KYOCERA Corporation, Kyoto-shi, Kyoto (JP)

(72) Inventor: Takeshi Kato, Kagoshima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 71 days.

(21) Appl. No.: 14/408,318

(22) PCT Filed: Oct. 29, 2013

(86) PCT No.: PCT/JP2013/079256
§ 371 (c)(1),
(2) Date: Dec. 16, 2014

(87) PCT Pub. No.: WO2014/069452
PCT Pub. Date: May 8, 2014

(65) Prior Publication Data
US 2015/0171306 A1   Jun. 18, 2015

(30) Foreign Application Priority Data

Oct. 29, 2012  (JP) ................................ 2012-238084

(51) Int. Cl.
*H01L 41/04* (2006.01)
*F02M 51/06* (2006.01)
(Continued)

(52) U.S. Cl.
CPC ....... *H01L 41/0472* (2013.01); *F02M 51/0603* (2013.01); *F02M 63/0225* (2013.01); *H01L 41/0475* (2013.01); *H01L 41/0838* (2013.01)

(58) Field of Classification Search
CPC ... F02M 51/00; F02M 51/06; F02M 51/0603; F02M 63/02; F02M 63/0225; H01L 41/0471; H01L 41/0472; H01L 41/08; H01L 41/083; H01L 41/0838; H01L 41/122; H01L 41/187; H01L 41/24

USPC .......... 123/456, 472, 478, 490, 498; 310/328, 310/364–366; 239/102.2, 585.1
See application file for complete search history.

(56) References Cited

U.S. PATENT DOCUMENTS 7,205,706 B2 *   4/2007  Kadotani ............ H01L 41/0472
                                          310/328
7,633,214 B2 * 12/2009  Okamura ............ H01L 41/0477
                                          310/363

(Continued)

FOREIGN PATENT DOCUMENTS

JP    2002-202024 A    7/2002
JP    2005-072325 A    3/2005

(Continued)

OTHER PUBLICATIONS

JP 2011-003574 English Translation.*
(Continued)

*Primary Examiner* — John Kwon
*Assistant Examiner* — Johnny H Hoang
(74) *Attorney, Agent, or Firm* — Volpe and Koenig, P.C.

(57) ABSTRACT

There are provided a multi-layer piezoelectric element which is capable of suppressing separation of an external electrode plate, as well as a piezoelectric actuator, an injection device, and a fuel injection system that are provided with the multi-layer piezoelectric element. A multi-layer piezoelectric element includes a stacked body composed of piezoelectric layers and internal electrode layers which are laminated; an external electrode plate attached to a side face of the stacked body via an electrically-conductive joining member; and a metal cover layer being disposed on a surface of the external electrode plate, an area of the metal cover layer corresponding to one end portion of the stacked body in a stacking direction of the stacked body having a thick-walled portion which is larger in thickness than an area of the metal cover layer corresponding to a midportion of the stacked body.

8 Claims, 4 Drawing Sheets

(51) Int. Cl.
*H01L 41/047* (2006.01)
*F02M 63/02* (2006.01)
*H01L 41/083* (2006.01)

(56) References Cited

U.S. PATENT DOCUMENTS

| | | | | |
|---|---|---|---|---|
| 8,201,543 B2* | 6/2012 | Morris | ............... | F02M 51/0603 123/494 |
| 2002/0158552 A1* | 10/2002 | Nakamura | .......... | H01L 41/0472 310/328 |
| 2010/0156251 A1* | 6/2010 | Hohmann | ........... | H01L 41/0472 310/364 |
| 2010/0313853 A1* | 12/2010 | Morris | ............... | F02M 51/0603 123/472 |

FOREIGN PATENT DOCUMENTS

| | | |
|---|---|---|
| JP | 2008-10742 A | 1/2008 |
| JP | 2011-176114 A | 9/2011 |

OTHER PUBLICATIONS

International Search Report, PCT/JP2013/079256, Nov. 15, 2013, 1 pg.

* cited by examiner (a)

(b)

MULTI-LAYER PIEZOELECTRIC ELEMENT, AND PIEZOELECTRIC ACTUATOR, INJECTION DEVICE, AND FUEL INJECTION SYSTEM PROVIDED WITH THE MULTI-LAYER PIEZOELECTRIC ELEMENT

TECHNICAL FIELD

The present invention relates to a multi-layer piezoelectric element for use as, for example, a piezoelectric driving element (piezoelectric actuator), a pressure sensor element, a piezoelectric circuit element, and so forth, as well as to a piezoelectric actuator, an injection device, and a fuel injection system that are provided with the multi-layer piezoelectric element.

BACKGROUND ART

As a multi-layer piezoelectric element, there is known a construction which includes: a stacked body composed of piezoelectric layers and internal electrode layers which are laminated; and an external electrode plate disposed on a side face of the stacked body so as to be electrically connected to the internal electrode layers via an electrically-conductive joining member. In a case where a metal cover layer (plating film) is disposed on the external electrode plate, it is designed to have a uniform thickness.

CITATION LIST

Patent Literature

Patent Literature 1: Japanese Unexamined Patent Publication JP-A 2008-10742

SUMMARY OF INVENTION

Technical Problem

In the multi-layer piezoelectric element described in Patent Literature 1, however, a lead wire is usually connected to the external electrode plate in order to let in inrush current through an end of the external electrode plate, and, upon the entry of inrush current, the end of the external electrode plate liberates heat, and the electrically-conductive Mining member liberates heat correspondingly. As the result of a repetition of the local heat generation, the electrically-conductive joining member suffers from quality degradation and consequent decline in holding capability, which may cause separation of the external electrode plate, and also, sparking occurs between the electrically-conductive joining member and the external electrode plate, which may cause an interruption of the operation of the multi-layer piezoelectric element.

Furthermore, there is a possibility that a piezoelectric actuator, an injection device, and a fuel injection system that are provided with the above-described multi-layer piezoelectric element cannot be driven with stability for a long period of time due to separation of the external electrode plate in the multi-layer piezoelectric element.

The invention has been devised in view of the problems as mentioned supra, and accordingly an object of the invention is to provide a multi-layer piezoelectric element which is capable of suppressing separation of an external electrode plate, as well as a piezoelectric actuator, an injection device, and a fuel injection system that are provided with the multi-layer piezoelectric element.

Solution to Problem

The invention provides a multi-layer piezoelectric element, comprising: a stacked body composed of piezoelectric layers and internal electrode layers which are laminated; an external electrode plate attached to a side face of the stacked body via an electrically-conductive joining member, and a metal cover layer being disposed on a surface of the external electrode plate, an area of the metal cover layer corresponding to one end portion of the stacked body in a stacking direction of the stacked body having a thick-walled portion which is larger in thickness than an area of the metal cover layer corresponding to a midportion of the stacked body.

Moreover, the invention provides a piezoelectric actuator, comprising: the above-described multi-layer piezoelectric element; and a case configured to house the multi-layer piezoelectric element thereinside.

Furthermore, the invention provides an injection device, comprising: a container provided with an injection hole; and the above-described multi-layer piezoelectric element, a fluid stored in the container being injected through the injection hole by driving the multi-layer piezoelectric element.

In addition, the invention provides a fuel injection system, comprising: a common rail configured to store a high-pressure fuel; the above-described injection device configured to inject the high-pressure fuel stored in the common rail; a pressure pump configured to supply the high-pressure fuel to the common rail; and an injection control unit configured to send a driving signal to the injection device.

Advantageous Effects of Invention

According to the multi-layer piezoelectric element of the invention, separation of the external electrode plate can be suppressed, and as a consequence, occurrence of sparking between the external electrode plate and the electrically-conductive joining member can be suppressed. This makes it possible to obtain an excellent multi-layer piezoelectric element which can be driven stably without causing fluctuation in the amount of drive for a long period of time.

Moreover, according to the piezoelectric actuator, the injection device, and the fuel injection system of the invention, since separation of the external electrode plate in the multi-layer piezoelectric element can be suppressed, they can be driven with stability for a long period of time.

DESCRIPTION OF EMBODIMENTS

Hereinafter, an embodiment of a multi-layer piezoelectric element according to the invention will be described in detail with reference to drawings.

Figure 1:
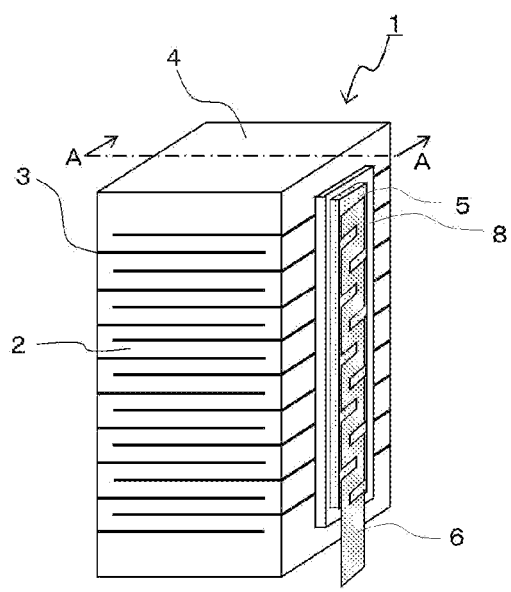
FIG. 1(a) is a schematic perspective view showing a multi-layer piezoelectric element according to an embodiment of the invention.
FIG. 1(b) is an enlarged sectional view of a main part thereof taken along the line A-A shown in FIG. 1(a)
Figure 1:
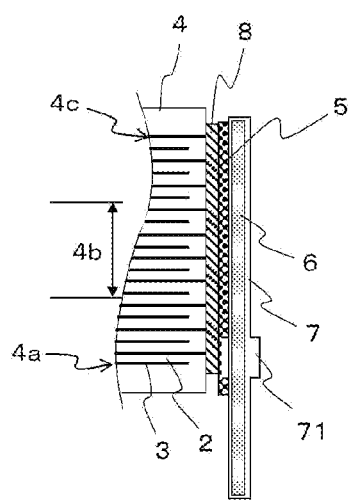

FIG. 1(a) is a schematic perspective view showing a multi-layer piezoelectric element according to an embodiment of the invention, and FIG. 1(b) is an enlarged sectional view of a main part thereof taken along the line A-A shown in FIG. 1(a). A multi-layer piezoelectric element 1 as shown in FIG. 1 comprises: a stacked body 4 composed of piezoelectric layers 2 and internal electrode layers 3 which are laminated; an external electrode plate 6 attached to a side face of the stacked body 4 via an electrically-conductive joining member 5; and a metal cover layer 7 being disposed on a surface of the external electrode plate 6, an area of the metal cover layer 7 corresponding to one end 4a of the stacked body 4 in a stacking direction of the stacked body having a thick-walled portion 71 which is larger in thickness than an area of the metal cover layer corresponding to a midportion 4b of the stacked body 4.

The stacked body 4 constituting the multi-layer piezoelectric element 1 is configured by laminating piezoelectric layers 2 and internal electrode layers 3, and more specifically comprises, for example, an active section 4d composed of piezoelectric layers 2 and internal electrode layers 3 which are alternately laminated, and an inactive section 4e composed of piezoelectric layers 2 located at each end of the active section 4d in the stacking direction, and, the stacked body 4 has a rectangular parallelepiped form which is, for example, 0.5 to 10 mm in length, 0.5 to 10 mm in width, and 1 to 100 mm in height.

The piezoelectric layer 2 constituting the stacked body 4 is made of ceramics having piezoelectric properties, and, as such ceramics, for example, a perovskite-type oxide made of lead zirconate titanate ($PbZrO_3$—$PbTiO_3$), lithium niobate ($LiNbO_3$), or lithium tantalate ($LiTaO_3$) can be used. The piezoelectric layer 2 has a thickness of 3 to 250 μm, for example.

The internal electrode layers 3 constituting the stacked body 4, which are formed through co-firing with ceramics used to form the piezoelectric layers 2, are alternately laminated with respect to the piezoelectric layers 2 so that one piezoelectric layer 2 is sandwiched between the internal electrode layers 3 in a vertical direction thereof, and, in the internal electrode layers 3, with the arrangement of positive electrodes and negative electrodes according to a stacking order, a driving voltage is applied to the piezoelectric layer 2 sandwiched between the positive and negative electrodes. As the constituent material, for example, a conductor composed predominantly of a silver-palladium alloy whose reactivity with piezoelectric ceramics is low, or a conductor containing copper, platinum, or the like can be used. In the example shown in FIG. 1, the positive electrodes and the negative (or grounding) electrodes are led out to a pair of opposed side faces of the stacked body 4 in a staggered arrangement. The internal electrode layer 3 has a thickness of 0.1 to 5 μm, for example.

Conductor layers 8 taken as a pair, which are each attached to a side face of the stacked body 4 so as to be electrically connected to the internal electrode layer 3, are formed on the opposed side faces of the stacked body 4, respectively, by, for example, application of a paste made of silver and glass with subsequent baking treatment so as to extend from one end of the stacked body 4 to the other end thereof in the stacking direction. The paired conductor layers 8 are each electrically connected to the internal electrode layers 3 led out to the opposed side faces of the stacked body 4 in a staggered manner. The conductor layer 8 has a thickness of 5 to 500 μm, for example.

The external electrode plate 6 is attached on the conductor layer 8 via the electrically-conductive joining member 5. It is preferable that the electrically-conductive joining member 5 in use is made of an electrically-conductive adhesive composed of epoxy resin or polyimide resin containing highly electrically conductive metal powder such as Ag powder or Cu powder. The electrically-conductive joining member 5 has, for example, a thickness of 5 to 500 μm, and is formed so as to extend from one end of the conductor layer 8 to the other end thereof. Note that, although the example shown in the drawings has the conductor layer 8 formed on the side face of the stacked body 4, the conductor layer 8 does not necessarily have to be provided, wherefore the external electrode plate 6 may be directly attached to the side face of the stacked body 4 via the electrically-conductive joining member 5. In this case, the electrically-conductive joining member 5 is formed so as to extend from one end of the active section 4d to the other end thereof in the stacking direction.

Moreover, the external electrode plate 6 is electrically connected to the internal electrode layer 3, and is attached to the side face of the stacked body 4 via the electrically-conductive joining member 5 in such a manner that part thereof protrudes from one of the end faces of the stacked body 4 in the stacking direction. The external electrode plate 6 is constructed of a flat plate made of metal such as copper, iron, stainless steel, or phosphor bronze, which has a width of 0.5 to 10 mm and a thickness of 0.01 to 1.0 mm, for example. In order for the external electrode plate 6 to have a form which is highly effective in lessening a stress caused by expansion and contraction of the stacked body 4, for example, a metal plate made to have slits disposed in its widthwise direction or have a meshed structure can be used for the external electrode plate 6.

The metal cover layer 7 is disposed on the surface of the external electrode plate 6. As a major constituent of the metal cover layer 7, a material which is smaller in resistance value than the material for forming the external electrode plate 6, for example, silver, nickel, or tin may be adopted, and preferably, the metal cover layer 7 is predominantly composed of silver. This is because silver has a high electrical conductivity, wherefore the electric resistance value of the metal cover layer 7 becomes smaller than that of the main body of the above-described external electrode plate 6 (electricity is allowed to flow more easily), which is conducive to suppression of generation of heat from the external electrode plate 6. Moreover, it is preferable that the metal cover layer 7 is made as a plating film. This is because the plating film has a uniform crystalline state and thus has a uniform resistivity in its entirety, wherefore there is no local increase in resistance. As the plating film, for example, a film made of silver plating is desirable for use.

Moreover, as shown in FIG. 1(b), in the invention, an area of the metal cover layer 7 corresponding to one end portion 4a of the stacked body 4 in the stacking direction has a thick-walled portion 71 which is larger in thickness than an area of the metal cover layer 7 corresponding to the midportion 4b of the stacked body 4.

It is noted that the thickness of the metal cover layer 7 refers to the sum of the thickness of the surface thereof at the inner side (the side toward the stacked body) of the external electrode plate 6 and the thickness of the surface thereof at the outer side of the external electrode plate 6.

Moreover, the midportion 4b of the stacked body 4 refers to the middle one of three portions of the stacked body 4 obtained by equally dividing the stacked body 4 in the stacking direction, and, the one end portion 4a of the stacked body 4 in the stacking direction refers to an end of the stacked body 4 located on the same side as the one end to which the metal cover layer 7 covering the external electrode plate 6 and an external lead member 9 are joined.

Specifically, the thick-walled portion 71 of the metal cover layer 7 is made to have a thickness of 5 to 20 μm, for example, and, another portion (thin-walled portion) thereof is made to have a thickness of 0.2 to 15 μm, for example, so that the difference in thickness between these portions is greater than or equal to 2 μm. It is particularly preferable that the thickness of the thick-walled portion 71 falls in a range of 5 to 15 μm and the thickness of another portion (thin-walled portion) falls in a range of 2 to 10 μm. Moreover, the thick-walled portion 71 is disposed so as to extend from one end to the other end of the external electrode plate 7 in its widthwise direction, and, the length of the thick-walled portion 71 in the stacking direction falls in a range of 0.1 to 2 mm, for example.

Thus, the thick-walled portion 71, which is a thick portion of the metal cover layer 7 disposed on the surface of the external electrode plate 6, has a small resistance value, and local heat generation is less likely to occur, which makes it possible to suppress quality degradation of the electrically-conductive joining member 5 caused by a repetition of heat generation, and thereby render the external electrode plate 6 resistant to separation. Moreover, at this portion, the difference in thermal expansion between the electrically-conductive joining member 5 and the external electrode plate 6 is decreased. As a result, occurrence of sparking between the electrically-conductive joining member 5 and the external electrode plate 6 can be suppressed.

This effect is attributable to the thickness of the thick-walled portion 71 made of a constituent material having a small resistance value, and, for example, even if the total thickness of the external electrode plate 6 and the metal cover layer 7 remains the same, so long as the ratio of the thickness of the metal cover layer 7 to that of the external electrode plate 6 is large, the effect can be attained.

While the thick-walled portion 71 is located in the vicinity of an end of the conductor layer 8 in the drawings, it is preferable that a region where the thick-walled portion 71 is disposed extends up to the end which is joined to the external lead member, because, in this case, a difference in resistance value from the low-resistance external lead member is small, wherefore local heat generation is less likely to occur in a range from a junction with the external lead member to a junction with the multi-layer piezoelectric element.

Moreover, an area between the thick-walled portion 71 and the other portion (thin-walled portion) may be stepped to cause an abrupt change in thickness, or, the area may be so configured as to cause a gradual change in thickness. In addition, the thick-walled portion 71 may be obtained by thickening only a main surface of the external electrode plate 6 that faces the stacked body 4, or thickening only a main surface thereof opposite to the stacked body 4.

Figure 2:
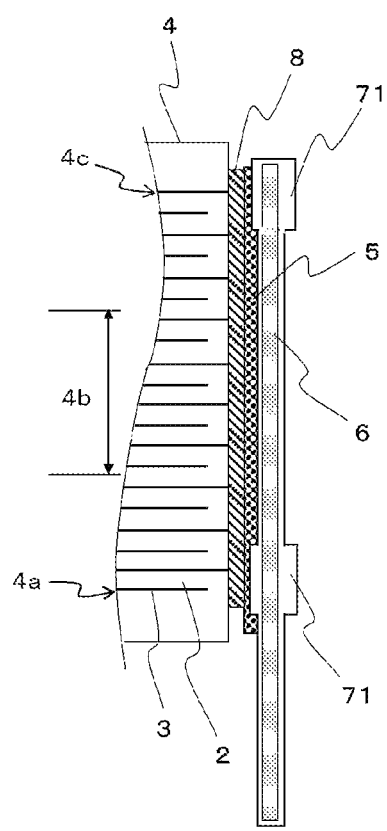
FIG. 2 is an enlarged sectional view showing a main part of a multi-layer piezoelectric element according to another embodiment of the invention, taken along the line A-A.

As shown in FIG. 2, it is preferable that an area of the metal cover layer 7 corresponding to the other end portion 4c of the stacked body 4 in the stacking direction also has an another thick-walled portion 71 which is larger in thickness than the area of the metal cover layer 7 corresponding to the midportion 4b of the stacked body 4.

The end areas of the external electrode plate 6 (the area corresponding to the one end portion 4a of the stacked body 4 and the area corresponding to the other end portion 4c of the stacked body 4) dissipate heat poorly and thus tend to liberate heat, wherefore the external electrode plate 6 is susceptible to separation. In this regard, in the invention, since the metal cover layer 7 provided on the surface of the external electrode plate 6 has the thick-walled portion 71 having a larger thickness located at each of the end areas (the area corresponding to the one end portion 4a of the stacked body 4 and the area corresponding to the other end portion 4c of the stacked body 4), it is possible to reduce the resistance value in the thick-walled portion 71 located at each of the end areas, and thereby suppress occurrence of local heat generation, and consequently the external electrode plate 6 becomes resistant to separation. Moreover, sparking caused by cracking can be suppressed even further.

Here, the one end portion 4a of the stacked body 4 in the stacking direction refers to a part which is included in one of three portions, defined as a one-end side (lower-end side in FIG. 1), of the stacked body 4 obtained by equally dividing the stacked body 4 in the stacking direction, extends across the inactive section 4e and the active section 4d, and ranges from the inactive section 4e to an end of the active section 4d. Moreover, the midportion 4b of the stacked body 4 in the stacking direction refers to the middle one of three portions, defined as a midsection within the region of the active section 4d, of the stacked body 4 obtained by equally dividing the stacked body 4 in the stacking direction. In addition, the other end portion 4c of the stacked body 4 in the stacking direction refers to a part which is included in one of three portions, defined as an other-end side (upper-end side in FIG. 1), of the stacked body 4 obtained by equally dividing the stacked body 4 in the stacking direction, extends across the inactive section 4e and the active section 4d, and ranges from the inactive section 4e to an end of the active section 4d.

Figure 3:
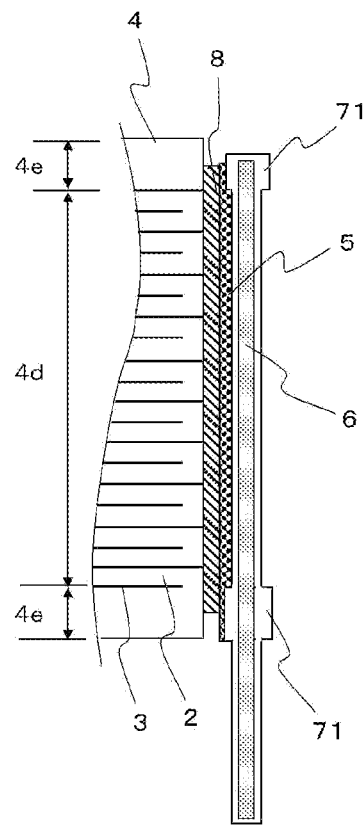
FIG. 3 is an enlarged sectional view showing a main part of a multi-layer piezoelectric element according to another embodiment of the invention, taken along the line A-A.

Moreover, as shown in FIG. 3, it is preferable that the stacked body 4 comprises the active section 4d composed of the piezoelectric layers 2 and the internal electrode layers 3 which are laminated, and the inactive section 4e composed of the piezoelectric layers 2 which are laminated, the inactive section 4e being located at each end of the active section 4d in the stacking direction, and that the thick-walled portion 71 is located in an area corresponding to the inactive section 4e. Although the inactive section 4b has no internal electrode layer 3 and thus dissipates heat poorly with the consequent susceptibility of the external electrode plate 6 to separation, by disposing the thick-walled portion 71 in the area corresponding to the inactive section, it is possible to improve heat dissipation at the external electrode plate 6 and the electrically-conductive joining member 5 corresponding to the inactive section 4e located at each end of the active section 4d in the stacking direction, and thereby render the external electrode plate 6 resistant to separation even further. Moreover, sparking caused by cracking can be suppressed even further.

Next, a method for manufacturing the multi-layer piezoelectric element 1 in accordance with the present embodiment will be described.

First, ceramic green sheets for forming the piezoelectric layers 2 are prepared. Specifically, calcined powder of piezoelectric ceramics, a binder made of an organic high polymer such as acrylic polymer or butyral polymer, and a plasticizer are mixed to prepare a ceramic slurry. Then, ceramic green sheets are prepared by a tape molding technique such as the doctor blade method or the calender roll method using this ceramic slurry. The piezoelectric ceramics may be of any given type so long as it has piezoelectric properties, and, for example, a perovskite-type oxide made of lead zirconate titanate ($PbZrO_3$—$PbTiO_3$) can be used. Moreover, as the plasticizer, dibutyl phthalate (DBP), dioctyl phthalate (DOP), or the like can be used.

Next, an electrically-conductive paste for forming the internal electrode layers 3 is prepared. Specifically, the electrically-conductive paste is prepared by admixing a binder and a plasticizer in metal powder of a silver-palladium alloy. This electrically-conductive paste is applied, in an internal-electrode-layer 3 pattern, on the aforementioned ceramic green sheet by means of screen printing. Then, a plurality of ceramic green sheets with the printed electrically-conductive paste are laminated on top of each other, and, the laminate is subjected to debinding, or binder removal treatment at a predetermined temperature, is fired at a temperature of 900 to 1200° C., and is ground into a predetermined shape by means of a surface grinder or otherwise, whereby the stacked body 4 composed of the piezoelectric layers 2 and internal electrode layers 3 which are alternately laminated is produced.

It is noted that the way of producing the stacked body 4 is not limited to the manufacturing method thus far described, and the stacked body 4 may therefore be produced by any given manufacturing method so long as it allows production of the stacked body 4 composed of piezoelectric layers 2 and internal electrode layers 3 which are laminated.

After that, the conductor layer 8 is formed by printing an electrically-conductive paste containing silver glass, which is prepared by adding a binder, a plasticizer, and a solvent to a mixture of glass and conductive particles composed predominantly of silver, in a conductor-layer 8 pattern, to the side face of the stacked body 4 by means of screen printing or otherwise; performing drying process; and performing baking process at a temperature of 650 to 750° C.

Next, the external electrode plate 6 is fixedly connected to the surface of the conductor layer 8 via the electrically-conductive joining member 5.

The electrically-conductive joining member 5 can be formed, with use of a conductive adhesive paste made of epoxy resin or polyimide resin containing highly electrically conductive metal powder such as Ag powder or Cu powder, while being adjusted to have predetermined thickness and width by the dispensing method.

The external electrode plate 6 is constructed of a flat plate made of metal such as copper, iron, stainless steel, or phosphor bronze, which has a width of 0.5 to 10 mm and a thickness of 0.01 to 1.0 mm, for example. In order for the external electrode plate 6 to have a form which is highly effective in lessening stress caused by expansion and contraction of the stacked body 4, for example, a metal plate made to have slits arranged in its widthwise direction or have a meshed structure is used for the external electrode plate 6.

Here, although the metal cover layer 7 is disposed on the surface of the external electrode plate 6, the metal cover layer 7 can be configured to include the thick-walled portion 71 by subjecting the entire external electrode plate 6 to electrolytic plating process, covering a part of the external electrode plate 6 other than a part where the thick-walled portion 71 is to be formed in order to avoid application of plating, and performing electrolytic treatment once again. Alternatively, the thick-walled portion 71 may be formed by means of flash plating or otherwise.

Subsequently, a DC electric field of 0.1 to 3 kV/mm is applied to the external electrode plate 6 connected to each of the paired conductor layers 8 for polarization of the piezoelectric layers 2 constituting the stacked body 4, whereby the multi-layer piezoelectric element 1 can be completed. In this multi-layer piezoelectric element 1, the conductor layer 8 and an external power source are connected to each other via the external electrode plate 6 for application of a voltage to the piezoelectric layers 2, so that each of the piezoelectric layers 2 can undergo significant displacement under an inverse piezoelectric effect. Thus, for example, the multi-layer piezoelectric element can be operated as an automotive fuel injection valve capable of supplying a jet of fuel into an engine.

Figure 4:
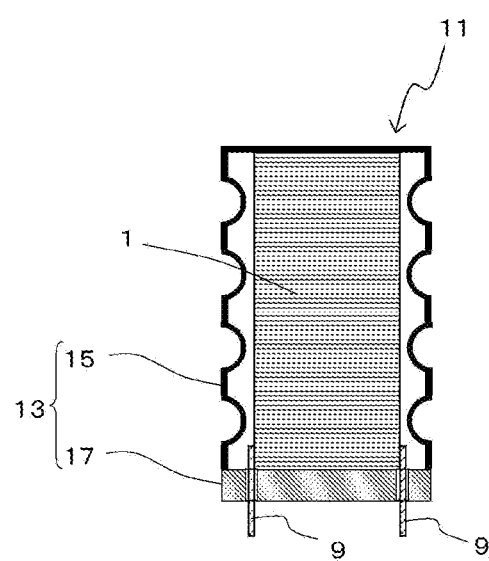
FIG. 4 is a schematic sectional view showing a piezoelectric actuator according to an embodiment of the invention.

Next, a piezoelectric actuator according to an embodiment of the invention will be described. FIG. 4 is a schematic sectional view showing a piezoelectric actuator according to an embodiment of the invention.

As shown in FIG. 4, a piezoelectric actuator 11 of the present example is configured by housing the multi-layer piezoelectric element 1 in a case 13.

Specifically, the case 13 is composed of: a case main body 15 with its upper end blocked and its lower end left opened; and a lid member 17 attached to the case main body 15 so as to block the opening of the case main body 15, and, the multi-layer piezoelectric element 1 is enclosed, together with an inert gas for example, inside the case 13, with its opposite end faces contacted by the inner wall of the upper end and the inner wall of the lower end, respectively, of the case 13.

The case main body 15 and the lid member 17 are made of a metal material such as SUS 304 or SUS 316L. The case main body 15 is a cylindrical body having a blocked upper end and an opened lower end, which has a bellows form capable of expansion and contraction in the stacking direction of the stacked body 7. Moreover, the lid member 17 has, for example, a plate form so as to block the opening of the case main body 15. The lid member 17 is formed with two through holes for insertion of the external lead members 9, so that electrical conduction between the external electrode 6 and the exterior thereof can be established by inserting the external lead member 9 into the through hole. Furthermore, soft glass or the like is filled in a gap at the through hole in order to secure the external lead member 9, as well as to prevent the entry of outside air.

According to the piezoelectric actuator 11 of the present embodiment, it can be driven with stability for a long period of time.

Figure 5:
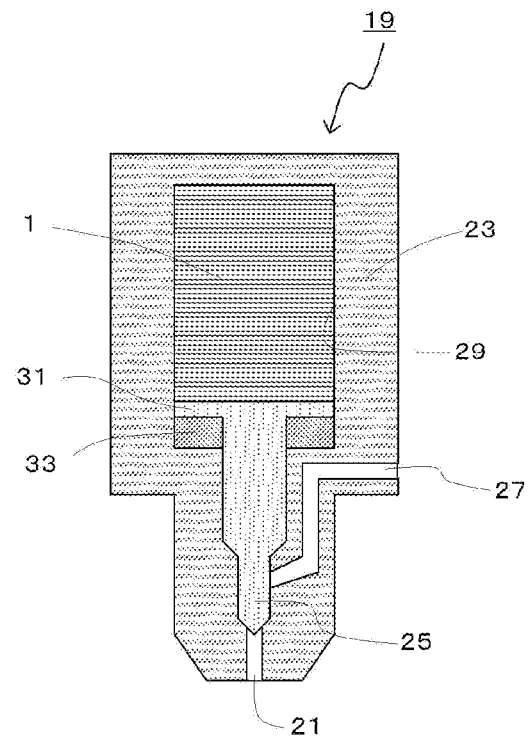
FIG. 5 is a schematic sectional view showing an injection device according to an embodiment of the invention.

Next, an injection device according to an embodiment of the invention will be described. FIG. 5 is a schematic sectional view showing an injection device according to an embodiment of the invention.

As shown in FIG. 5, an injection device 19 of the present embodiment is configured by housing the multi-layer piezoelectric element 1 of the foregoing embodiment inside a housing container (container) 23 provided with an injection hole 21 at one end thereof.

A needle valve 25 which can open and close the injection hole 21 is arranged inside the housing container 23. In the injection hole 21, a fluid passage 27 is disposed so as to be communicated in accordance with the movement of the needle valve 25. The fluid passage 27 is connected to an external fluid supply source, and the fluid is constantly supplied to the fluid passage 27 at high pressure. Accordingly, the injection device is configured so that, when the needle valve 25 opens the injection hole 21, the fluid supplied to the fluid passage 27 is injected through the injection hole 21 to the outside or an adjacent container, for example, a fuel chamber (not shown) of an internal-combustion engine.

Moreover, a diameter of an upper end portion of the needle valve 25 is large, which forms a piston 31 which can slide with a cylinder 29 formed in the housing container 23. Then, the multi-layer piezoelectric element 1 of the above embodiment is housed in the housing container 23 so as to contact the piston 31.

In such an injection device 19, as the multi-layer piezoelectric element 1 is expanded by voltage application, the piston 31 is pressed and the needle valve 25 closes the fluid passage 27 communicated to the injection hole 21 to stop the supply of fluid. When the voltage application is stopped, the multi-layer piezoelectric element 1 is contracted, a disc spring 33 presses back the piston 31, the fluid passage 27 is opened and the injection hole 21 is communicated to the fluid passage 27, thereby injecting the fluid through the injection hole 21.

It is noted that the injection device may be configured to open the fluid passage 27 by applying the voltage to the multi-layer piezoelectric element 1 and to close the fluid passage 27 by stopping the voltage application.

Moreover, the injection device 19 of the present embodiment may include the container 23 provided with the injection hole and the multi-layer piezoelectric element 1 of the present embodiment, wherein the fluid filled inside the container 23 is injected through the injection hole 21 by driving the multi-layer piezoelectric element 1. That is, it is not always necessary that the multi-layer piezoelectric element 1 is inside the container 23 but it is sufficient that a pressure for controlling the injection of fluid is applied to the inside of the container 23 by driving the multi-layer piezoelectric element 1. In the injection device 19 of the present embodiment, the fluid includes various types of liquids and gases such as the conductive paste in addition to fuel, ink and so on. By using the injection device 19 of the present embodiment, it is possible to control the flow rate and the injection timing of the fluid stably for a long period of time.

In the case where the injection device 19 of the present embodiment applying the multi-layer piezoelectric element 1 according to the present embodiment is used for the internal-combustion engine, it is possible to inject the fuel to the combustion chamber of the internal-combustion engine such as an engine accurately for a long period of time as compared with a conventional injection device.

Figure 6:
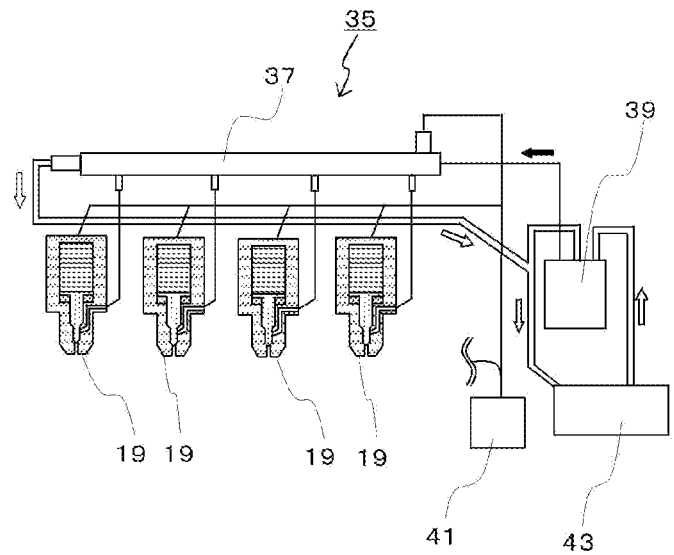
FIG. 6 is a schematic block diagram showing a fuel injection system according to an embodiment of the invention.

Next, a fuel injection system according to an embodiment of the invention will be described. FIG. 6 is a schematic diagram showing a fuel injection system according to an embodiment of the invention.

As shown in FIG. 6, a fuel injection system 35 of the present embodiment includes a common rail 37 configured to store a high-pressure fuel as high-pressure fluid, a plurality of injection devices 19 according to the present embodiment configured to inject the high-pressure fluid stored in the common rail 37, a pressure pump 39 configured to supply the high-pressure fluid to the common rail 37, and an injection control unit 41 configured to send drive signals to the injection devices 19.

The injection control unit 41 controls the injection amount and timing of high-pressure fluid based on external information or the signal from the outside. For example, in the case of using the injection control unit 41 for the fuel injection of the engine, it is possible to control the amount and timing of fuel injection while detecting the condition in the combustion chamber of the engine by a sensor or the like. The pressure pump 39 has a function of supplying the fluid fuel to the common rail 37 at high pressure from a fuel tank 43. For example, in the case of the fuel injection system 35 of the engine, the fluid fuel is fed to the common rail 37 with high pressure of 1000 to 2000 atmospheres (approximately 101 MPa to approximately 203 MPa), and preferably 1500 to 1700 atmospheres (approximately 152 MPa to approximately 172 MPa). The common rail 37 stores high-pressure fuel fed from the pressure pump 39 to be appropriately fed to the injection devices 19. The injection device 19 injects a fixed amount of fluid to the outside or the adjacent container from the injection hole 21 as described above. For example, where a target of fuel supply by injection is an engine, the injection device injects the high-pressure fuel in a mist form into the combustion chamber of the engine through the injection hole 21.

It should be understood that the application of the invention is not limited to the embodiments described heretofore, and that various changes and modifications are possible without departing from the scope of the invention. For example, the sectional profile of the stacked body 4 in a direction perpendicular to the stacking direction may be defined by, instead of the rectangular shape as adopted in the foregoing embodiments, a polygonal shape such as a hexagonal shape or an octagonal shape, or a circular shape, or a shape of combination of straight lines and arcs.

For example, the multi-layer piezoelectric element 1 of the present embodiment is used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning apparatus such as an optical apparatus, and an anti-vibration apparatus. Examples of the sensor element include a combustion pressure sensor, a knocking sensor, an acceleration sensor, a load sensor, an ultrasound sensor, a pressure-detecting sensor, and a yaw-rate sensor. Moreover, examples of the circuit element include a piezoelectric gyroscope, a piezoelectric switch, a piezoelectric transformer, and a piezoelectric breaker.

EXAMPLES

Examples of the invention will be described.

A piezoelectric actuator provided with the multi-layer piezoelectric element of the invention was produced in the following manner. To begin with, a ceramic slurry was prepared by mixing calcined powder of piezoelectric ceramics composed predominantly of lead zirconate titanate ($PbZrO_3$—$PbTiO_3$) having an average particle size of 0.4 μm, a binder, and a plasticizer. Then, ceramic green sheets for forming 50 μm-thick piezoelectric layers were prepared by the doctor blade method using this ceramic slurry.

Next, an electrically-conductive paste for forming the internal electrode layers was prepared by adding a binder to a silver-palladium alloy.

Next, the electrically-conductive paste for forming the internal electrode layers was printed to one side of the ceramic green sheet by means of screen printing, and 200 ceramic green sheets with the printed electrically-conductive paste were laminated on top of each other. Moreover, with this laminate of 200 ceramic green sheets having the printed electrically-conductive paste for forming the internal electrode layers set as a core, 15 ceramic green sheets having no printed electrically-conductive paste for forming the internal electrode layers were laminated on each of the top and the bottom of the core. Then, the resultant laminate was fired at a temperature of 980 to 1100° C., and ground into a predetermined shape by means of a surface grinder, whereupon a stacked body having an end face of 5 mm square was obtained.

Next, a conductor layer was formed by printing an electrically-conductive paste prepared by blending a binder into silver and glass to a part of the side face of the stacked body where the conductor layer is to be formed by means of screen printing, and then performing baking treatment at a temperature of 700° C.

Next, an electrically-conductive adhesive in the form of a paste of a mixture of Ag powder and polyimide resin was applied to the surface of the conductor layer by a dispenser, and, an external electrode plate was fixedly connected to the surface of the stacked body in parallel therewith.

By way of Sample 1, there was adopted an external electrode plate provided with a metal cover layer configured so that an area of the metal cover layer corresponding to one end of the stacked body in the stacking direction is formed as a thick-walled portion which is made larger in thickness than an area of the metal cover layer corresponding to a midportion of the stacked body.

Moreover, by way of Sample 2, there was adopted an external electrode plate provided with a metal cover layer configured so that an area of the metal cover layer corresponding to the other end of the stacked body in the stacking direction is also formed as another thick-walled portion which is made larger in thickness than the area of the metal cover layer corresponding to the midportion of the stacked body (configured so that both of the area corresponding to one end of the stacked body and the area corresponding to the other end thereof in the stacking direction are made larger in thickness than the area corresponding to the midportion of the stacked body as thick-walled portions).

Furthermore, by way of Sample 3, there was adopted an external electrode plate with a thick-walled portion located in an area corresponding to each end of the stacked body in the stacking direction, or equivalently an area corresponding to each inactive section.

In addition, by way of Comparative example, there was adopted an external electrode plate provided with a metal cover layer having substantially the same (uniform) thickness at each of its opposite ends and midportion.

Then, a SUS-made securing member of 4 mm square was fixed centrally of the end face of the element with a very small amount of an adhesive.

In each of these multi-layer piezoelectric elements, a DC electric field of 3 kV/mm has been applied to the external electrode plate via a lead member welded to the external electrode plate for 15 minutes to effect polarization. Then, as the result of application of DC voltage of 160 V to the multi-layer piezoelectric elements, a displacement of 30 μm was found in the stacking direction of the stacked body. Moreover, as durability tests, the multi-layer piezoelectric elements were driven continuously under application of AC voltage ranging from 0 V to +160 V at a frequency of 150 Hz at a temperature of 30° C. and at a humidity of 90%.

As a result, in the multi-layer piezoelectric element of Comparative example, cracking occurred in the stacked body after continuous driving of $1\times10^4$ times, and eventually the operation of the multi-layer piezoelectric element was caused to stop.

On the other hand, in the multi-layer piezoelectric element of Sample 1, although its operation was not caused to stop even after continuous driving of $1\times10^7$ times, the amount of drive in the stacked body was reduced. In addition, the multi-layer piezoelectric element of Sample 2 continued to operate without suffering from cracking even after continuous driving of $1\times10^7$ times, and also there was no sign of a change in the amount of drive.

Moreover, the multi-layer piezoelectric element of Sample 3 continued to operate without suffering from cracking even after continuous driving of $1\times10^9$ times, and also there was no sign of a change in the amount of drive.

As will be understood from the test results as described heretofore, according to the invention, a multi-layer piezoelectric element having excellent long-term durability can be implemented.

REFERENCE SIGNS LIST

1: Multi-layer piezoelectric element
2: Piezoelectric layer
3: Internal electrode layer
4: Stacked body
4a: One end portion
4b: Midportion
4c: Other end portion
4d: Active section
4e: inactive section
5: Electrically-conductive joining member
6: External electrode plate
7: Metal cover layer
71: Thick-walled portion
8: Conductor layer
19: Injection device
21: Injection hole
23: Housing (container)
25: Needle valve
27: Fluid channel
29: Cylinder
31: Piston
33: Belleville spring
35: Fuel injection system
37: Common rail
39: Pressure pump
41: Injection control unit
43: Fuel tank

The invention claimed is:

1. A multi-layer piezoelectric element, comprising:
a stacked body composed of piezoelectric layers and internal electrode layers which are laminated;
an external electrode plate attached to a side face of the stacked body via an electrically-conductive joining member; and
a metal cover layer being disposed on a surface of the external electrode plate,
an area of the metal cover layer corresponding to one end portion of the stacked body in a stacking direction of the stacked body having a thick-walled portion which is larger in thickness than an area of the metal cover layer corresponding to a midportion of the stacked body.

2. The multi-layer piezoelectric element according to claim 1,
wherein an area of the metal cover layer corresponding to the other end portion of the stacked body in the stacking direction also has an another thick-walled portion which is larger in thickness than the area of the metal cover layer corresponding to the midportion of the stacked body.

3. The multi-layer piezoelectric element according to claim 1,
wherein the stacked body comprises an active section composed of the piezoelectric layers and the internal electrode layers which are laminated, and an inactive section composed of the piezoelectric layers which are laminated, the inactive section being located at each end of the active section in the stacking direction,
and wherein the thick-walled portion is located in an area corresponding to the inactive section.

4. The multi-layer piezoelectric element according to claim 1,
wherein the metal cover layer is predominantly composed of silver.

5. The multi-layer piezoelectric element according to claim 1,
wherein the metal cover layer is formed of a plating film.

6. A piezoelectric actuator, comprising:
the multi-layer piezoelectric element according to claim 1; and a case configured to house the multi-layer piezoelectric element thereinside.

7. An injection device, comprising:

a container provided with an injection hole; and the multi-layer piezoelectric element according to claim 1, a fluid stored in the container being injected through the injection hole by driving the multi-layer piezoelectric element.

8. A fuel injection system, comprising:

a common rail configured to store a high-pressure fuel;

the injection device according to claim 7, the injection device being configured to inject the high-pressure fuel stored in the common rail;

a pressure pump configured to supply the high-pressure fuel to the common rail; and an injection control unit configured to send a driving signal to the injection device.

* * * * *